United States Patent

King

[11] Patent Number: 5,604,026
[45] Date of Patent: Feb. 18, 1997

[54] ELECTRICALLY CONDUCTIVE ADHESIVES

[75] Inventor: David R. King, Elkton, Md.

[73] Assignee: W. L. Gore & Associates, Inc., Newark, Del.

[21] Appl. No.: 465,021

[22] Filed: Jun. 5, 1995

Related U.S. Application Data

[63] Continuation-in-part of Ser. No. 147,196, Nov. 3, 1993, abandoned.

[51] Int. Cl.$^6$ .................... B32B 3/26; B32B 7/12
[52] U.S. Cl. .................... 428/317.1; 428/317.3; 428/317.5; 428/317.7; 428/343; 428/344; 428/354
[58] Field of Search .................... 428/317.1, 317.5, 428/317.7, 343, 344, 354, 317.3

[56] References Cited

U.S. PATENT DOCUMENTS

| | | | |
|---|---|---|---|
| 3,953,566 | 4/1976 | Gore. | |
| 4,385,102 | 5/1983 | Fitzky et al. | 429/111 |
| 4,557,957 | 12/1985 | Manniso. | |
| 4,857,668 | 8/1989 | Buonanno | 174/35 GC |
| 4,912,594 | 3/1990 | Bannink, Jr. et al. | 361/218 |
| 5,202,536 | 4/1993 | Buonnano | 174/35 GC |
| 5,269,810 | 12/1993 | Hull. | |

FOREIGN PATENT DOCUMENTS 0560072 9/1993 European Pat. Off..

OTHER PUBLICATIONS

Patent Abstracts of Japan vol. 017, No. 009 (E–1303) 8 Jan. 1993 & JP, A, 04 242 010 (Sony Chem Corp) 28, Aug. 1992.

*Primary Examiner*—Marion E. McCamish
*Assistant Examiner*—Elizabeth M. Cole
*Attorney, Agent, or Firm*—Victor M. Genco, Jr.

[57] ABSTRACT

An electrically conductive adhesive is described that is made of a porous substrate having numerous passages extending through it. The walls of the substrate defining the passages are plated with a conductive metal. This provides a continuous plating from one side of the porous substrate to the other. The remaining passage volume is substantially filled with an adhesive resin. The adhesive can be used to electrically connect two metal surfaces.

8 Claims, 1 Drawing Sheet

ELECTRICALLY CONDUCTIVE ADHESIVES

CROSS REFERENCE TO RELATED APPLICATIONS

This application is a continuation-in-part of application Ser. No. 08/147,196, filed Nov. 3, 1993, now abandoned.

BACKGROUND OF THE INVENTION

In many electronic applications, it is necessary to connect two metal surfaces in order to properly ground two separate components. These components can be items like IC chips, packages, hybrid components, multichip modules, printed circuit boards, ceramic substrates, heat sinks, chassis and housings. It is often impractical or impossible to mechanically secure the two components with screws or clamps, in which case it is desirable to use an electrically conductive adhesive.

Commonly, polymeric conductive adhesives, such as epoxy resins loaded with conductive particles, such as carbon or silver or the like, are used. However, particles in a resin matrix frequently do not achieve good conductive efficiency because over time the particles tend to shift in the resin matrix and change the conductivity. Furthermore, in applications where high conductivity is needed, the amount of particles in the adhesive needs to be high, e.g., as high as 80% filler in some instances. The large amount of particles is needed to insure particle to particle contact through the resin matrix. This high amount of particles causes the resin/filler combination to be brittle or of weak bond strength.

Because of the high surface resistance of particle to particle contact, applications that require high conductivity must use silver particles because other metals form oxides too readily and produce higher resistance adhesives. Moreover, when it is necessary to bond aluminum parts and high conductivity is required, there is a problem with using silver particles because the silver reacts galvanically with aluminum and causes corrosion to occur.

SUMMARY OF THE INVENTION

Because of the proclivity of the aforementioned conductive particles to form oxides at the particle interfaces, the inventive adhesive of this invention avoids use of particles. This invention provides an electrically conductive adhesive comprising a porous substrate having numerous passages extending through the substrate, in which the walls of the substrate defining the passages are coated, or plated, with a conductive metal so as to provide a continuous covering from one side of the substrate to the other, and in which the remaining passage volume is substantially filled with an adhesive resin.

DETAILED DESCRIPTION OF THE INVENTION

Figure 1:
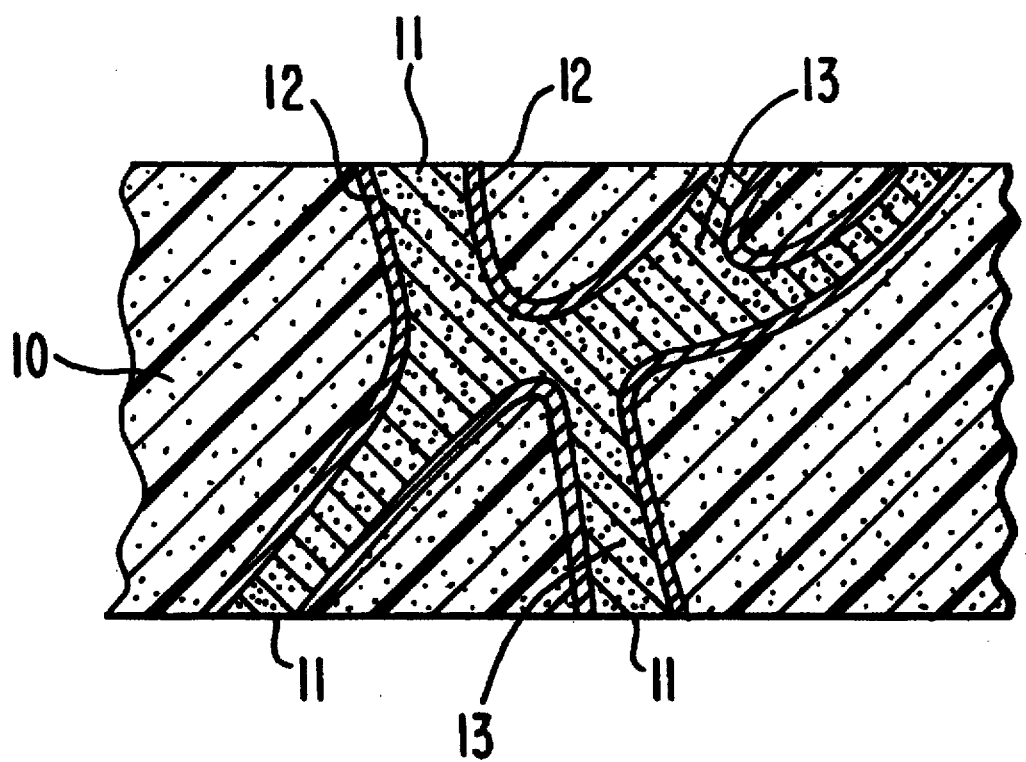
FIG. 1 is a cross-section of an adhesive film of the invention.

Referring to FIG. 1, in this invention a substrate structure 10 is provided which has passageways 11 extending from one side of the substrate to the other. The substrate can be a fabric, a porous membrane, a foam, or the like. Preferably it should be resilient and compressible to provide compliance when used as an adhesive substrate. The fabric can be a woven, nonwoven, knit or the like, provided it has the requisite passageways. Representative fabrics can be polyamide, PTFE, polyester, polyurethane or polyimide, or the like. An especially preferred substrate, for its strength, compressibility, temperature resistance, flame retardancy and chemical inertness is expanded porous polytetrafluoroethylene (PTFE) preferred as described in U. S. Pat. No. 3,953,566 which has a microstructure of nodes interconnected by fibrils in the nodes and fibrils define the continuous passageways or pores.

The substrate will generally be between 0.3 and 40 mil thick (7.6 micrometers to 1 millimeter) and generally will take the form of a sheet, although the shape can be matched to the components that are being bonded together.

The walls of the passageways have adhered to them a continuous conductive metal 12 (see FIG. 1) which can be formed on the walls by an electroless plating procedure. Representative conductive metals include copper, nickel, silver, gold, and the like. The metal coating, or plating, does not fill the passageway volume but only covers the material defining the passageways.

When the substrate is a polymeric fabric such as a polyester fabric, such conductive plated substrates are available from Monsanto Colo., under the tradename Flectron materials.

When the substrate is expanded porous PTFE, the conductive plated substrate can be prepared as described generally in Manniso, U.S. Pat. No. 4,557,957.

Once the conductive metal material is in place on the walls of the pores, the remaining pore volume is filled with a nonconductive adhesive 13 (see FIG. 1 ). Suitable adhesives include epoxy resin, acrylic resin, urethane resin, silicone resin, polyimide resin, cyanate ester resin, or the like. The adhesive is conveniently imbibed into the pores by immersing the substrate in a solution of the adhesive. For an epoxy resin adhesive, a suitable solvent is methylethylketone.

The resulting adhesive-filled, conductively coated substrate so prepared is useful as a conductive adhesive.

The adhesive can be used to bond components together. Commonly the adhesive is placed between two metallic surfaces and heat and pressure applied, as required, until a bond is formed. Because of the conductive coating extending from one side of the adhesive to the other, an electrical current flows from one metal surface to the other.

EXAMPLE 1

An electrically conductive adhesive was prepared using a substrate of a 5 mil (127 micrometer) thick sheet of plated microporous PTFE made by W. L. Gore & Associates, Inc., Part Number NC17201-04-1. The metal comprising the plating was nickel over copper.

The sheet was impregnated with an epoxy adhesive resin (Nelco N-4205-2) in an methylethylketone (MEK) solvent (20% solids by weight) by immersing for 15 seconds at 25° C. The solvent was then evaporated at 163° C. in an oven. The epoxy imbibed sheet was determined to contain 30% epoxy resin by weight.

The adhesive product prepared as above was tested by bonding two aluminum plates together. Specifically, two aluminum plates that had not been treated with surface-treating chemicals, 2 inches in diameter (5.08 centimeters) were placed in an oven with a sheet of the adhesive product between them. Pressure of 1 psi (2.88 kg/cm$^2$) for 1 hour at 150° C. was used to effect bonding. An electrical current was passed through the assembly from one plate to the other. A resistance of 0.0086 ohms was measured through the aluminum and the conductive adhesive, which included the surface resistance of the aluminum.

EXAMPLE 2

An electrically conductive adhesive was prepared by using a 15 mil thick, nonwoven polyester fabric made by Monsanto and designated as Flectron nonwoven polyester fabric. The Flectron fabric was 2.5 oz./sq. yd. total weight with a minimum of 0.64 oz./sq. yd. of metal weight. The metal plating on the fabric was nickel plated over copper.

The interstices of the plated polyester were then impregnated with a high temperature epoxy adhesive resin (Nelco N-4205-6) in an MEK solvent (20% solids by weight) by immersing for 15 seconds at 25° C. The solvent was evaporated by heating at 163° C., leaving a plated fabric that contained 30% resin by weight. This material formed the conductive adhesive.

The conductive adhesive was used to bond two aluminum plates together that were 3.0 inches in diameter. The bonding was done at 50 psi pressure and 176° C. for 1.5 hours in the same apparatus as in Example 1. A resistance of less than 0.001 ohms was measured through the aluminum and the conductive adhesive.

EXAMPLE 3

In this example, a 3.8 mil thick woven polyester fabric made by Monsanto and designated as Flectron H1 polyester taffeta was used. This material was coated with copper that had been antioxidant treated. No nickel under-coating was present. Imbibing with epoxy was carried out as described in Example 1. The resulting adhesive contained 30% by weight epoxy resin and 25% by weight metal. This material, consisting of resin coated, metallized, woven polyester formed the conductive adhesive.

The conductive adhesive was used to bond two aluminum plates together that were 1.0" square. The bonding was done at 1 psi pressure and 176° C. for hour. A resistance of less than 0.5 ohms was measured through the aluminum and the conductive adhesive.

Comparison Example A

A common commercially available electrically conductive adhesive (Ablefilm ECF-561-003 made by Ablestik, a division of National Starch and Chemical Company), which is an epoxy resin containing silver particles, was used to bond two aluminum plates together that were 2.0 inch in diameter using the same types of plates and same lamination conditions as described in Example 1 (the bonding was done at 1 psi pressure and 150° C. for 1 hour). A four probe ohm meter was used to test the resistance through the aluminum and the adhesive of both the Ablestik product and the material bonded in Example 1. Both samples were tested on the same piece of equipment at the same time. The resistance value for the commercially available silver adhesive was measured to be 0.291 ohms while the resistance value for the adhesive demonstrated in Example 1 was measured to be 0.0086 ohm. In addition to the adhesive demonstrated in Example 1 having only about 3% of the resistance demonstrated by the commercially available adhesive, the adhesive demonstrated in Example 1 also has the following advantages: It is noncorrosive against the aluminum, it does not require cold storage; it is easier handling, and has no free particles that can short adjacent parts.

EXAMPLE 4

Example 1 was repeated except that polybutadiene adhesive (Ricon 104) was used instead of the epoxy, and the Ricon 104 adhesive was surface coated to a thickness of 0.7 mils on both sides of the sheet.

The coated sheet was then bonded at 150° C. for 1 hour between two aluminum plates at 1 psi which forces the adhesive into the pores. The plates were one inch square untreated aluminum. The resistivity was measured as in Example 1 and was 0.015 ohm.

Comparison Example B (Comparison with Example 4)

A carbon particle filled (50% by volume) microporous polytetrafluoroethylene sheet obtained from W. L. Gore & Associates, Inc., was bonded to aluminum plates as in Example 4 and tested for resistance. The resistance was 9.8 ohm.

Comparison Example C (Comparison with Example 4)

In a manner like Comparison Example B, an 80% filled (by volume) microporous polytetrafluoroethylene sheet, in which the filler was silver coated copper particles, obtained from W. L. Gore & Associates, Inc., was bonded to aluminum plates, and tested for resistivity. The resistivity was 1.1 ohm.

I claim:

1. An electrically conductive film comprising:

a planar substrate having numerous passageways through the substrate from one side to the other in which the passageways are defined by a plurality of walls of the material making up the substrate;

said walls being covered with a continuous layer of conductive metal;

said layer covering said walls but leaving the passageways open from said one side to the other;

said open passageways being filled with an adhesive resin, thereby forming an electrically conductive film which permits electrical current to flow from a first surface of the planar substrate, through the planar substrate, to a second surface thereof.

2. A conductive assembly comprising:

an electrically conductive film defined by a planar substrate having first and second planar surfaces and having numerous passageways through the substrate from one side to the other in which the passageways are defined by a plurality of walls of the material making up the substrate, said walls being covered with a continuous layer of conductive metal, said layer covering said walls but leaving the passageways open from said one side to the other, said open passageways being filled with an adhesive resin;

at least a first conductive surface bonded to the first planar surface; and at least a second conductive surface bonded to the second planar surface, wherein the conductive assembly permits an electrical current to flow from the first conductive surface, through the electrically conductive film, and to the second conductive surface.

3. The invention of claims 1 or 2, wherein the planar substrate is a porous organic polymer or a porous fabric.

4. The invention of claims 1 or 2, wherein the planar substrate is an organic polymer selected from the group consisting of: polytetrafluoroethylene, polyamide, polyester, polyolefin, polyurethane and polyimide.

5. The invention of claims 1 or 2, wherein the planar substrate is a porous polytetrafluoroethylene sheet having a morphology of numerous micronodes interconnected by microfibrils and the passageway walls comprise said micronodes and microfibrils, and wherein the conductive metal covers said micronodes and microfibrils.

6. The invention of claims 1 or 2, wherein the planar substrate is a porous fabric made of fibers selected from the group consisting of: polytetrafluoroethylene, polyamide, polyester, polyolefin, polyurethane and polyimide.

7. The invention of claims 1 or 2, wherein the conductive metal is selected from the group consisting of: copper and nickel.

8. The invention of claims 1 or 2, wherein the adhesive resin comprises an organic resin selected from the group consisting of: epoxy, urethane, acrylic and cyanate ester.

* * * * *